United States Patent
Zieman

(10) Patent No.: US 8,233,285 B2
(45) Date of Patent: Jul. 31, 2012

(54) LINECARD TO CHASSIS SECURING

(75) Inventor: Christopher Zieman, Chapel Hill, NC (US)

(73) Assignee: Cisco Technology, Inc., San Jose, CA (US)

( * ) Notice: Subject to any disclaimer, the term of this patent is extended or adjusted under 35 U.S.C. 154(b) by 366 days.

(21) Appl. No.: 12/581,629

(22) Filed: Oct. 19, 2009

(65) Prior Publication Data

US 2011/0090655 A1    Apr. 21, 2011

(51) Int. Cl.
   *H05K 5/00*    (2006.01)
   *H05K 7/14*    (2006.01)

(52) U.S. Cl. ........ 361/759; 361/747; 361/754; 361/756; 361/798

(58) Field of Classification Search ................ 24/595.1; 439/157, 347; 361/686, 727, 741, 747, 754, 361/756, 759, 785, 788, 796, 798
See application file for complete search history.

(56) References Cited

U.S. PATENT DOCUMENTS

| | | | | |
|---|---|---|---|---|
| 4,318,157 A | * | 3/1982 | Rank et al. | 361/704 |
| 4,354,770 A | * | 10/1982 | Block | 403/409.1 |
| 4,480,287 A | * | 10/1984 | Jensen | 361/707 |
| 4,824,303 A | * | 4/1989 | Dinger | 411/79 |
| 4,869,680 A | * | 9/1989 | Yamamoto et al. | 439/327 |
| 4,914,552 A | * | 4/1990 | Kecmer | 361/801 |
| 5,317,482 A | * | 5/1994 | Bujtas | 361/798 |
| 5,607,273 A | * | 3/1997 | Kecmer et al. | 411/79 |
| 5,779,388 A | * | 7/1998 | Yamamoto | 403/374.1 |

OTHER PUBLICATIONS

"Cisco CRS-1 Carrier Routing System 16-Slot Line Card Chassis Installation Guide", Cisco Systems, Inc., Chapter 4, pp. 1-74; May 2008.

* cited by examiner

*Primary Examiner* — Timothy Thompson
*Assistant Examiner* — Sherman Ng
(74) *Attorney, Agent, or Firm* — Brinks Hofer Gilson & Lione

(57) ABSTRACT

A holder secures a linecard to a chassis. The holder acts as a releasable expansion bolt. To alleviate tolerance requirements for the linecard and/or chassis, the holder secures with minimal additional pressure being applied to force the linecard against the chassis. Rather than screwing a linecard face plate to the chassis card guide, the holder locks the linecard in place without requiring movement of the face plate against the chassis card guide. A gap may remain between the face plate and the chassis, substantially allowing for a desired amount of insertion of electrical connectors without adverse pressure or movement caused by the securing.

19 Claims, 7 Drawing Sheets

LINECARD TO CHASSIS SECURING

FIELD OF TECHNOLOGY

The present embodiments relate to securing a linecard to a chassis. In particular, the present embodiments relate to securing a linecard to a chassis with sufficient connector engagement.

BACKGROUND

A linecard is locked into place within a chassis with a screw. The linecard-to-chassis interface point is at the connectors or the front linecard panel flange (or ejector flange) and the front bend of the card guides. To ensure proper pin connectivity, placement of the connector nominally takes into account all the tolerances from the midplane up to the front card guide bend as well as all the tolerances across the PCB and through the linecard carrier to the front panel flange. If the linecard is over long or the chassis under long due to manufacturing tolerances, locking the linecard to the chassis may result in insufficient connection of the pins or excessive pressure on the connector and midplane of the chassis. Excessive pressure, especially from multiple linecards, may cause the midplane to deflect, possibly resulting in poor electrical connection. In the case of radio frequency (RF) connectors, separation impacts the connector's ability to maintain proper RF performance, specifically return loss.

DETAILED DESCRIPTION

Figure 1:
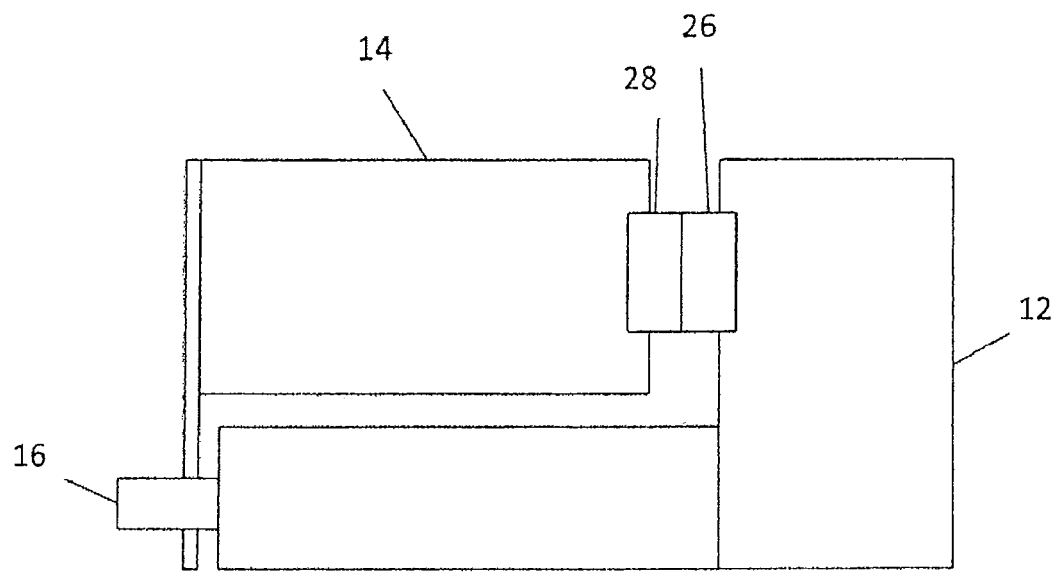
FIG. 1 illustrates one embodiment of a system for securing a linecard with a chassis.

The present embodiments relate to systems and methods for securing a linecard to a chassis. In one embodiment, a holder acts as a releasable expansion bolt. To alleviate tolerance requirements for the linecard and/or chassis, the holder secures with minimal additional pressure being applied to force the linecard against the chassis. Rather than screwing a linecard face plate to the chassis card guide, the holder fastens the linecard in place without requiring movement of the face plate against the chassis card guide. A gap may remain between the face plate and the chassis, substantially allowing for a desired amount of insertion of electrical connectors without adverse pressure or movement caused by the securing.

In a first aspect, a system includes a chassis having a second electrical connector arranged to mate with a first electrical connector of a linecard when the linecard is removeably positioned within the chassis. A holding connector is configured to connect the linecard to the chassis. The holding connector includes a pin with a chamfered surface, a wedge arranged to contact the chamfered surface, a retainer, and a drive arranged to drive the wedge against the chamfered surface such that friction between the wedge and the chamfered surface removably holds the linecard relative to the chassis.

In a second aspect, a system includes a linecard having a first electrical connector arranged to mate with the second electrical connector of a chassis when the linecard is removeably positioned within the chassis. A front panel connector is configured to hold the linecard relative to the chassis at any one of a range of gaps between a face plate of the linecard and the chassis.

In a third aspect, a method is provided. A linecard is inserted within a chassis. A linecard pin connector is engaged with another pin connector within the chassis by performing the inserting. The linecard is fastened within the chassis after the engaging. The fastening substantially leaves any gap between a face plate of the linecard and the chassis.

In one embodiment, a linecard-to-chassis retainer (holder) has: a pin fixed to the chassis that has an angled lead-in on the tip and a threaded hole, a retainer connected to the linecard face plate, a wedge with an angle that mates with the fixed pin such that contact generates interference and frictional holding forces when pressed on by a drive screw, the drive screw over which the wedges fit and that is retained in the retainer, and a c-ring to hold the wedge to the screw. The threads of the drive screw fit into the pin. Threading presses on the wedges axially to generate frictional holding forces.

The frictional holding forces captivate the linecard to the chassis where the linecard sits relative to the chassis. The linecard is secured without substantially moving the linecard or without substantially adding additional forces on the linecard-chassis interface. Substantially is used to provide for minor motion or force due to pressing a screw driver against the screw to activate the holder, handling forces, or minor motion or force caused by activation of the holder, such as motion caused by the pin sliding along to the wedges.

Usually, linecards are retained with a captive screw pulling a face plate tight against the card guide. This pulling may cause extra forces on the electrical connectors due to tolerances stacking up in a common direction. Rather than requiring the electrical connectors to be separated a bit to account for tolerance stack up, the captive retaining design uses a screw actuated wedge design to generate frictional forces in place. The frictional forces hold the system in place in X-Y-Z dimensions where the linecard sits.

This holder embodiment allows the linecard-chassis electrical connectors to be fully mated more consistently. The electrical connectors are installed completely to a bottomed-out position. Friction keeps the electrical connectors engaged once the pressure is released. The fixed pin on the top of the linecard front plate may also help keep the connectors mated during installation. Once in place, the holder is activated to captivate the linecard in the fixed and desired position relative to the chassis. A gap may remain, such as due to purposeful design to avoid tolerance stack-up. The linecard is fixed in place without completely closing the gap or applying substantial pressure on the electrical connectors.

Other holders or retainers may be used. Any structure that allows the gap to remain without placing substantial force on the electrical connectors may be provided. For example, a cam based device may be used instead of or in addition to a wedge device.

Figure 2:
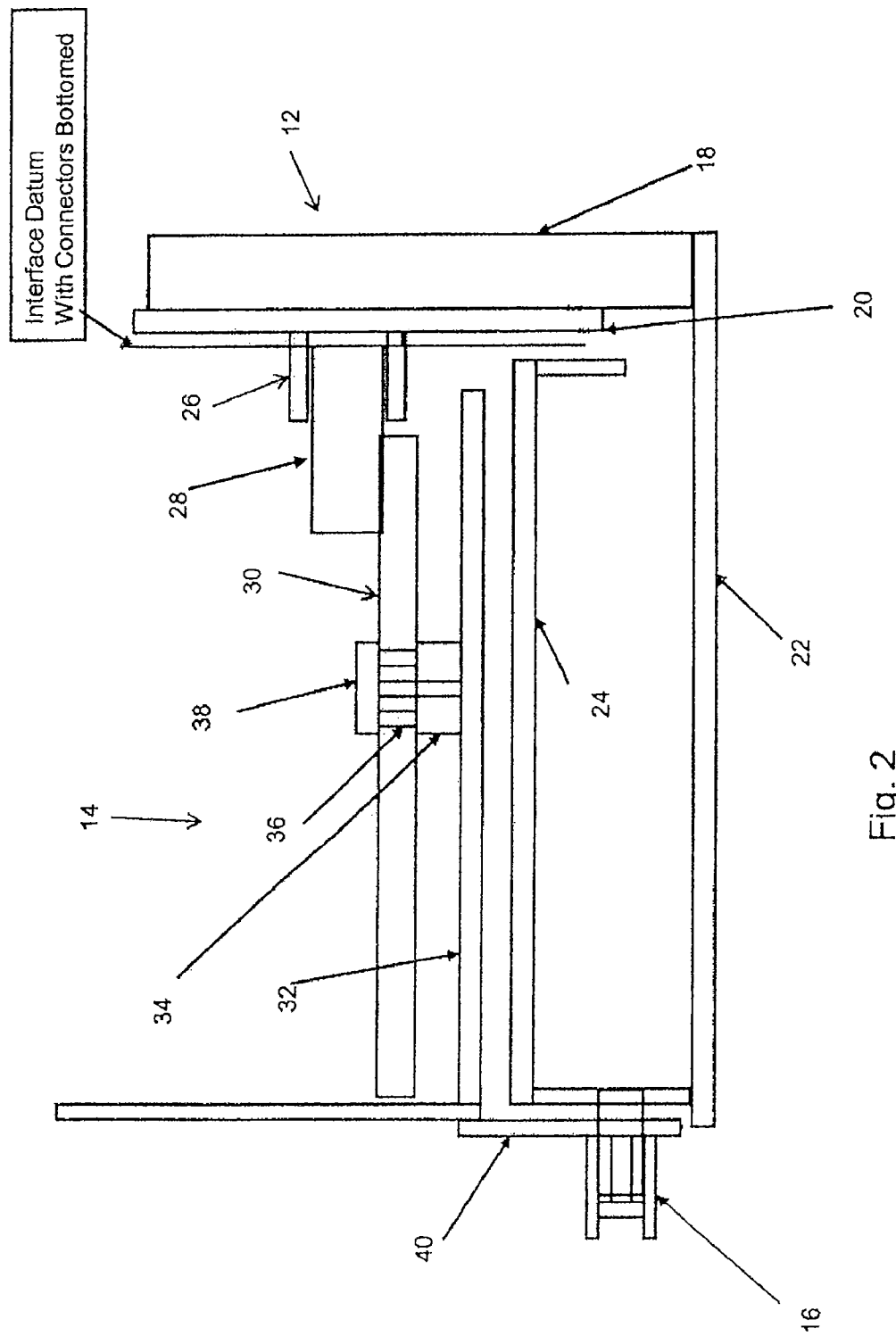
FIGS. 2 and 3 illustrate other embodiments of the system for securing the linecard with a chassis.
Figure 3:
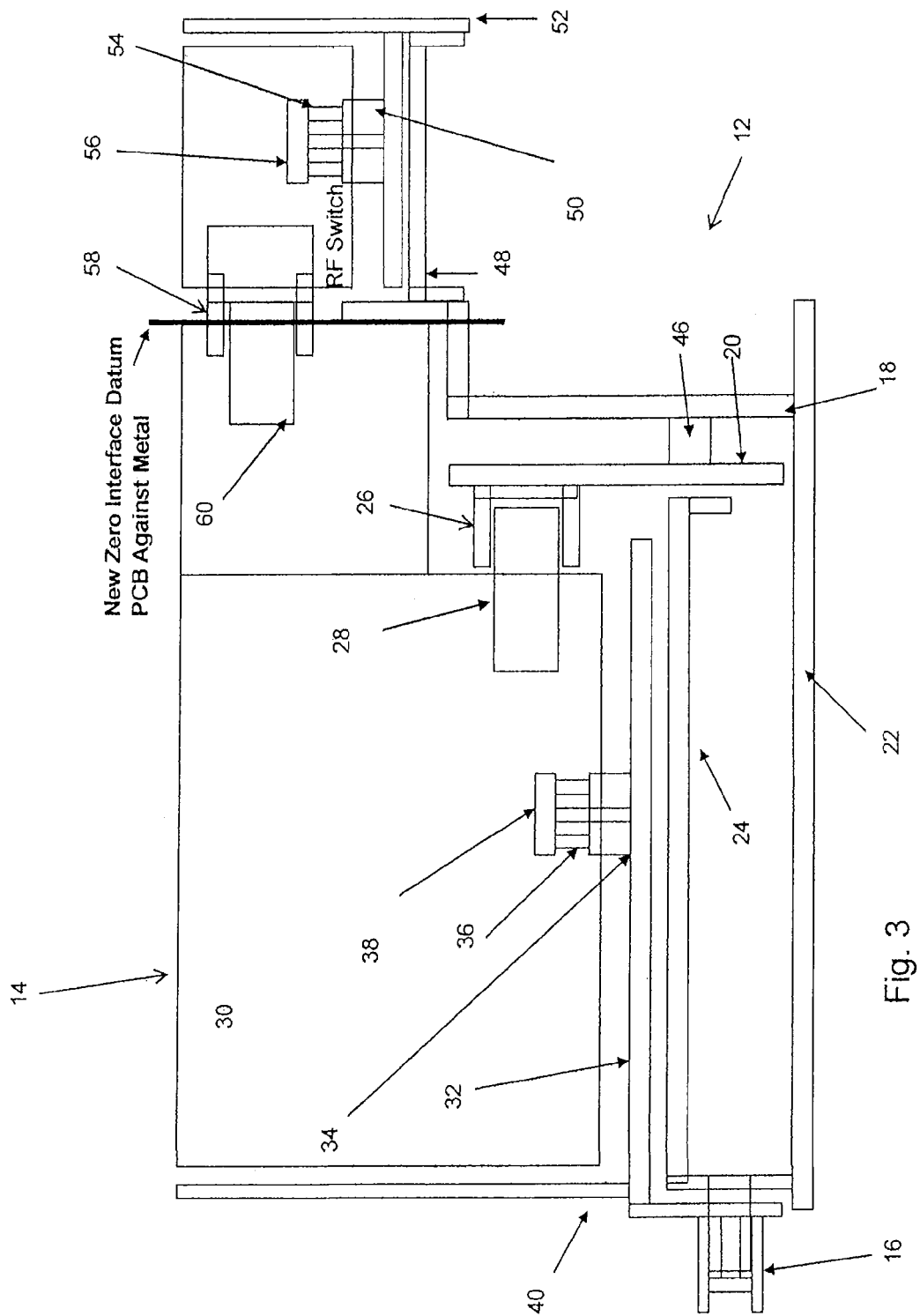

FIG. 1 shows one embodiment of a system for securing a linecard 14 to a chassis 12. FIGS. 2 and 3 show other embodiments of the system, such as for use with a digital electrical connection (FIG. 2) or both digital and radio frequency electrical connection (FIG. 3). The system is used for any device, such as a cable modem termination system, server system, or any other system where linecards 14 are mounted in or to a chassis 12.

The system includes the linecard 14, the chassis 12, and the holder 16. Additional, different, or fewer components may be provided. For example, more than one linecard 14 is used. The chassis 12 may accept any number of linecards 14. As another example, more than one holder 16 is used for each linecard 14, such as using two holders 16. In other examples, just the holder 16, the linecard 14 and holder 16, the chassis and the holder 16, or portions of the holder 16 are provided.

The chassis 12 is of any now known or later developed construction. For example, the chassis 12 is formed from metal, such as sheet metal, with any attached components. Chassis components include one or more electrical connectors 26, corresponding wires, and/or circuit boards.

FIGS. 2 and 3 show two embodiments of the chassis 12. In FIG. 2, the chassis 12 includes a midplane or backplane bracket 18, a midplane or backplane 20, a chassis side wall 22, a card guide 24, and the connector 26. Additional, different, or fewer components may be provided. For example in FIG. 3, the chassis 12 additionally includes a midplane or backplane standoff 46 and another card guide 48. As another example, a plurality of card guides 24 is provided for aligning linecards 14.

The midplane or backplane bracket 18 and card guides 22 are formed from sheet metal, but other materials may be used. The sheet metal for the card guides 22 may be bent or folded to form a guide bend and/or for placement of connectors at desired locations, such as bending to allow riveting of the card guide 22 to the midplane or backplane bracket 18.

One or more electrical connectors 26, 58 are positioned on the chassis 12 or on components held by the chassis 12 (e.g., the connector 58 is on another linecard held by the chassis 12). The electrical connectors 26, 58 are any now known or later developed connector. For example, the connectors 26 are digital connectors with a field of pins, contacts, and/or sheathes for electrically connecting with the connectors 28 on the linecard 14. As another example, the connector 58 is a radio frequency or coaxial connector for electrically connecting with the connector 60 on the linecard 14.

The connectors 26, 58 are female connectors for receiving corresponding male connectors 28, 60 within a latch system or inner diameter. In alternative embodiments, the connectors 26, 58 on the chassis 12 are male connectors, or both male and female connectors are provided. The connectors 26, 58 have a corresponding depth or pin wipe. For desired operation, the male connectors are inserted sufficiently within the female connectors. The connectors are typically designed to operate correctly with full insertion where the male connector bottoms out (contacts an edge or structure preventing further insertion) on the female connector. Less insertion may still be operable. Inadequate insertion may result in signal noise or lack of operation.

The electrical connectors 26, 58 and/or holder 16 allow for removable insertion of the linecard 14 within the chassis 12. The connectors 26, 58 may be sized to provide friction or require pressure for insertion, but not otherwise latch. Alternatively, latching is provided, but a mechanism or access is provided to release the latching. In alternative embodiments, the latching is fixed, preventing removal of the linecard 14 from the chassis 12.

The card guides 22 and electrical connectors 26, 58 define slots or locations for insertion of the linecard 14 within the chassis 12. The chassis 12 may enclose the linecard 14, but may also have an open construction for supporting without enclosing the linecard 14. The linecard 14 is guided by the card guides 22 to mate the electrical connectors 26, 28 and 58, 60.

The linecard 14 is of any now known or later developed construction. For example, the linecard 14 is formed from metal, such as sheet metal, printed circuit board material, and/or plastic with any attached components. Linecard components include one or more electrical connectors 28, corresponding wires, and/or circuit boards.

FIGS. 2 and 3 show two embodiments of the linecard 14. The linecard 14 includes a printed circuit board 30 with a screw hole 36, a linecard carrier 32, a standoff 34, a screw 38, and a face plate 40. Additional, different, or fewer components may be provided. For example, the linecard 14 of FIG. 3 includes a plurality of electrical connectors 28, 60.

The linecard carrier 32 is metal or other material to slide on, mate with, or contact the card guide 24. The carrier standoff 34, screw hole 36, and screw 38 allow connection of the printed circuit board 30 of the linecard 14 to the linecard carrier 32. Other attachment mechanisms may be used.

The linecard carrier 32 attaches to the face plate 40 (e.g., linecard ears). Alternatively, the face plate 40 attaches to the printed circuit board 30. Any attachment may be used. In one embodiment, the face plate 40 is formed, such as cast, as part of the linecard carrier 32. For example, the face plate 40 is a front linecard panel flange or ejector flange. The face plate 40 is positioned to provide a gap with the card guide 24 when the electrical connectors 26, 28 are fully mated. Any size gap may be provided, such as offsetting the face plate 40 by 0.08 inches. The gap ensures that the face plate 40 is not the bottoming out point for the connectors 26, 28. Since the system is designed to provide a gap, lesser tolerances may be allowed as opposed to designing the face plate 40 to contact the chassis 12 at the same amount of insertion as where the electrical connectors 26, 28 bottom out.

To contain electromagnetic interference (EMI), the gap may include a gasket or other electrically insulating material. The material may be flexible or later added. For example, the side edges of the linecard are gasketed to provide side EMI containment.

The electrical connectors 28, 60 physically and electrically connect with the printed circuit board 30. The electrical connectors 28, 60 mate with the connectors 26, 58 of the chassis 12 or held by the chassis 12.

In one embodiment shown in FIG. 3, the electrical connector 60 of the linecard 14 mates with an electrical connector 58 of another linecard. The other linecard also includes a carrier, standoff 50, printed circuit board with a screw hole 54, and screw 56. This other linecard connects within the chassis 12. A securing device may be used, such as screw through a face plate 52 into a card guide 48. Alternatively, a holder 16 is used.

Figure 4:
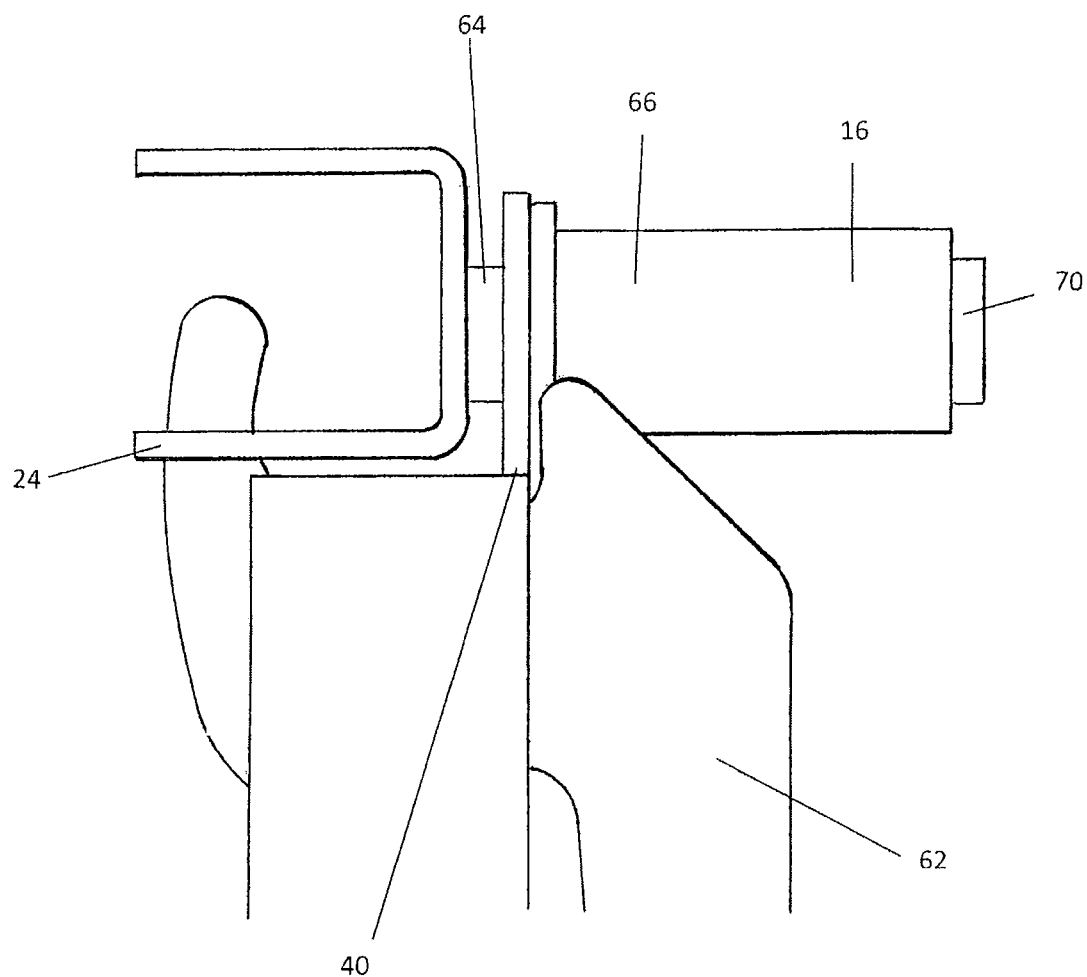
FIG. 4 is an external side view of a holder, according to one embodiment, for securing a linecard with a chassis.

As shown in FIG. 4, one or more ejectors 62 are provided for inserting the linecard 14 into the chassis 12. The ejector 62 includes a handle rotatably connected to the face plate 40 of the linecard 14. A protrusion extends for insertion into a hole or at an edge in the chassis 12, such as the card guide 24. By rotating the handle, the protrusion contacts the chassis 12 and places inward pressure on the linecard 14 to cause engagement of the electrical connectors 26, 28. The protrusion is shaped to cause further insertion with further rotation so complete, full, or sufficient engagement of the electrical connectors 26, 28 is provided. Other ejectors may be used. In other embodiments, the linecard 14 is inserted by hand without the ejector 62.

Once the linecard 14 is placed within or against the chassis 12, the holder 16 secures the linecard 14 in place relative to the chassis 12. The holder 16 is a holding connector or panel fastener system configured to connect the linecard 14 to the chassis 12. As shown in FIGS. 1-4, the holder 16 connects the front panel 40 to the chassis 12, acting as a front panel connector. In other embodiments, the holder 16 is positioned at other locations on the linecard 14 and/or to connect with other portions of the chassis.

The holder 16 has at least one extension and one clamping device arranged to clamp against the extension at any of a plurality of locations. The extension connects to or is formed as part of the linecard 14 or the chassis 12. The clamping device connects to or is formed as part of the other of the chassis 12 or the linecard 14. The clamping device may clamp at various locations along the extension.

In one embodiment, the clamping device is independent of the chassis 12 and the linecard 14, but instead clamps both components together. For example, an extension from the chassis 12 is clamped to an extension from the linecard 14. The two extensions are placed adjacent to each other over the range of possible clamping locations. The clamping device of the front panel connector holds the extensions in place relative to each other. By allowing clamping of the one or more extensions at different locations, different relative positions of the linecard 14 to the chassis 12 may be used while the linecard 14 is secured.

The clamping device is a wedge, cam, detent, side screw, post, or other device for holding. The clamping device is positioned to provide minimal, none, or little force along an insertion axis of the linecard 14. For example, a cam rotates to clamp against the extension at an angle perpendicular to an insertion axis. Other positions may be used.

In one embodiment shown in FIGS. 4-7, the holder 16 is based on expansion bolt concepts, allowing front side screw captivation similar to a screw holder. The holder 16 includes a pin 64 (first extension), a retainer 66 (second extension), a wedge 68, a screw 70 (clamping device together with the wedge 68), and a c-ring 72. Additional, different, or fewer components may be provided. For example, the c-ring 72 is not provided. The components are metal, but other materials may be used.

The pin 64 is a cylinder, but may be a flat plate, rod, or other shape. The pin 64 is of any size. In one embodiment, the pin 64 is about ¼ inch in diameter and ¼ inch long pin of plated, cold rolled steel.

Figure 5:
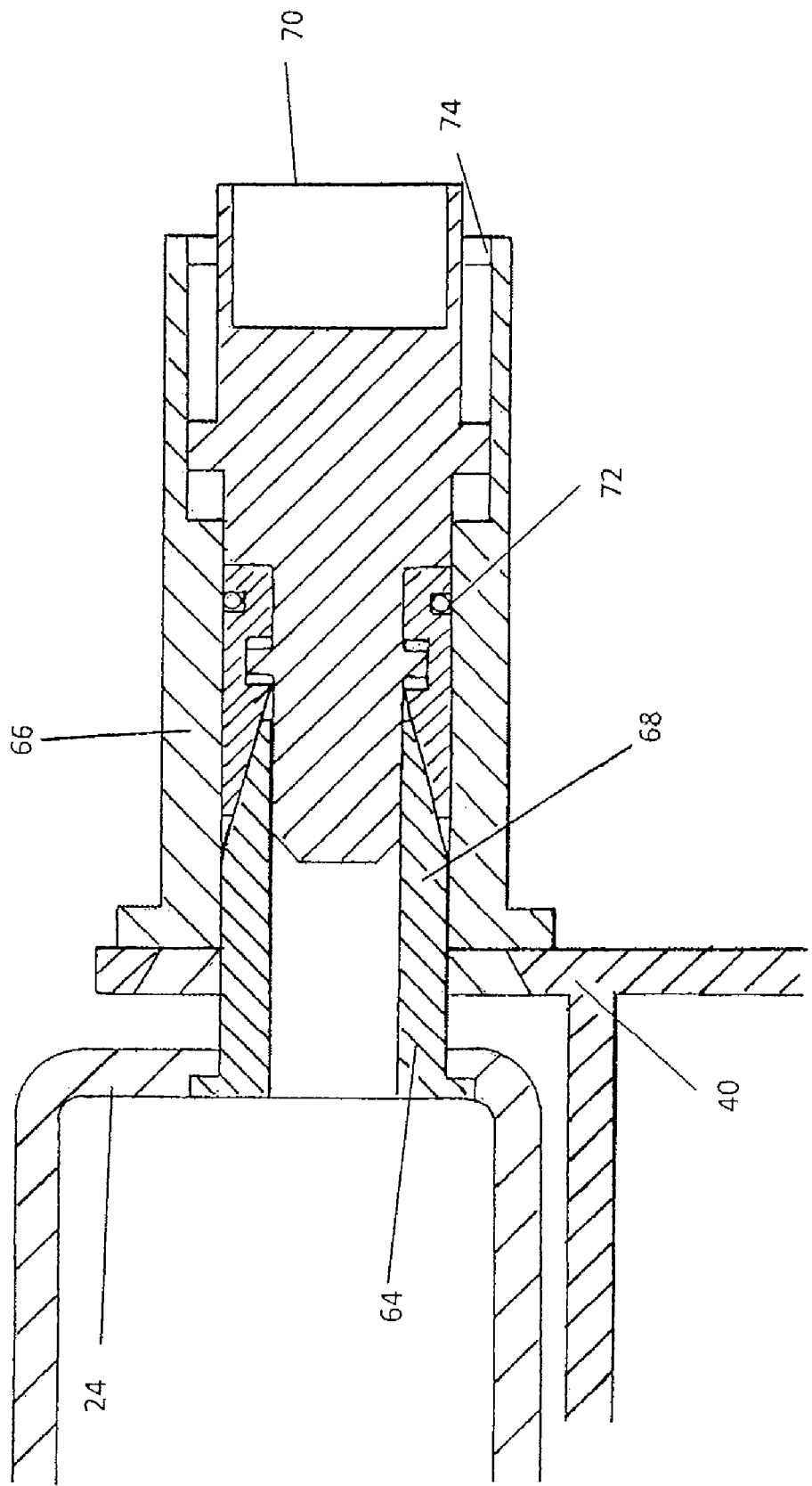
FIG. 5 is a cross-section view of the holder of FIG. 4.

The pin 64 has a chamfered surface. The chamfered surface is a beveled surface extending around an outer circumference of one end of the pin 64. Any angle from the longitudinal axis of the pin 64 may be provided. FIG. 5 shows a 15 degree surface, but an angle of about 10-25 degrees or other angles may be provided. "About" is used to account for differences in friction between the pin 64 and the wedge 68 along the chamfered surface. In other embodiments, the chamfered surface is formed from one or more flat regions rather than extending around an entire circumference.

The pin 64 includes an inner hollow portion. Alternatively, a hole through only part of the pin 64 is provided. The inner portion is threaded. Any threading to mate with the screw 70 may be used, such as M3.5 threading. The threading applies force to move the screw 70 towards or away from the pin 64 due to rotation of the screw 70. Using the wedge 68, the pin 64 acts like an expansion bolt interface when engaged by the screw 70.

The pin 64 connects with the card guide 24 of the chassis 12. Any connection may be used, such as welding, sonic welding, or press fit. The connection is fixed, such as not allowing movement or only allowing minimal movement along the longitudinal axis of the pin 64. Rotation about the axis is prevented or not prevented.

The wedge 68 is one or more (e.g., two) pieces of metal, such as aluminum or cast metal. The wedge 68 is sized and shaped to contact the chamfered surface of the pin 64. For example, the wedge is a cylinder with an interior beveled surface at one end. The angle of the beveled surface is the same as or similar to the angle of the chamfered surface of the pin 64. In an alternative embodiment, the wedge shaping is provided around less than an entire circumference. The two beveled surfaces may be coated, machined, treated, polished, or worked to provide more or less friction.

The wedge 68 is also shaped to engage the screw 70. For example, a groove extends around an interior surface of the wedge 68. The groove may contact a ring of the screw 70 for applying extraction force from the screw 70 to the wedge 68 to release the secure hold. The groove may also be used for applying insertion force to frictionally engage the wedge 68 with the pin 64. In the embodiment shown, an end of the wedge 68 contacts the screw 70 to push the wedge towards the pin 64 for engaging the hold.

The outer size and shape of the wedge 68 is arranged to be insertable within the retainer 66. For example, the wedge 68 is loosely fit within the retainer 66. The size may be such to minimize slippage and increase compression or retaining forces as the wedge 68 contacts the chamfered surface of the pin 64. A groove may be provided for the c-ring 72.

The retainer 66 is an aluminum or cast metal cylinder, but may have other materials and/or shapes. The inner diameter of the retainer 66 is sized to allow insertion of the pin 64, wedge 68, and screw 70 with small gaps but without pressing. The inner diameter may be different at different locations, such as having a larger diameter to accept a ring or other extension from the screw 70. Either formed as part of the retainer 66 or limited by a press fit ring 74, the larger diameter region allows limited movement of the screw 70 along the longitudinal axis. The larger diameter region may prevent the screw 70 from being removed from the retainer 66. In other embodiments, the screw 70 is removable.

The retainer 66 connects with the face plate 40 of the linecard 14. Any connection may be used, such as welding, sonic welding, or press fit. The connection is fixed, such as not allowing movement or only allowing minimal movement along the longitudinal axis of the retainer 66. Rotation about the axis is prevented or not prevented. In an alternative embodiment, the end of the retainer 66 is flared adjacent to a limiting ring on the retainer 66. The flared region is press fit through a hole in the face plate 40 up to the limiting ring. The retainer 66 may be press fit into the hole and then flared. The flared fit allows rotation of the retainer 66. The hole in the face plate 40 may be circular or elongated, such as forming a groove. For example, the flared fit prevents the retainer 66 from movement along the longitudinal axis of the retainer 66, but allows sliding of the retainer 66 along the elongated hole. This fit allows freedom along one dimension. The retainer 66 may have a "D" or other non-circular outer shape to limit rotation while allowing movement along the elongated axis of the hole. Other connections allowing motion may be provided.

In one embodiment, two separate holders 16 are provided for a linecard 14. One of the holders 16 includes a retainer 66 connected to allow motion. The other holder 16 includes a retainer 66 not allowed to move in the hole or allowed to move in the hole in a same or different direction, such as having the holes elongated in perpendicular directions in the plane of the face plate 40. The movement allows alignment of the pins 64 with additional tolerance, but holds the linecard 14 in place once secured. For example, one holder 16 is fixed, limiting X, Y, and Z motion of the linecard when secured. The other holder 16 is able to float or move to the limits of the groove along a Z axis within the plane of the face plate 40. This float allows for card cage tolerances. When secured, the second holder 16 prevents motion along the X and Y dimensions. Together, the holders 16 prevent motion along the X, Y and Z dimensions, where the Y dimension is the longitudinal or insertion axis.

Misalignment of the pin 64 relative to the retainer 66 may result in some alteration or undesired force during insertion. The pin 64 may be connected in a way allowing some movement. Alternatively, the pin 64 is fixed. The fixed pin 64 may not limit backplane connectivity. A small (e.g., 0.002 inches) radial clearance on the pin 64 to retainer 66 corresponds to a 0.458 degree angular tilt of the connector 26. This angular tilt corresponds to a 0.0879" movement at the back of the linecard connector 22 at 11 inches along the backplane. Most midplane connectors 26 may accommodate up to 1 deg of angular tilt or more.

The screw 70 is a drive arranged to drive the wedge 68 against the chamfered surface of the pin 64. Other drive mechanism may be provided, such as a cam. The screw 70 is formed from cold rolled, hardened steel or cast metal, but other materials may be used.

The screw 70 has outer threading. The threading is sized and shaped to mate with the inner threading of the pin 64. For example, the screw 70 is a M3.5 locking drive screw acting as a setting screw.

Figure 6:
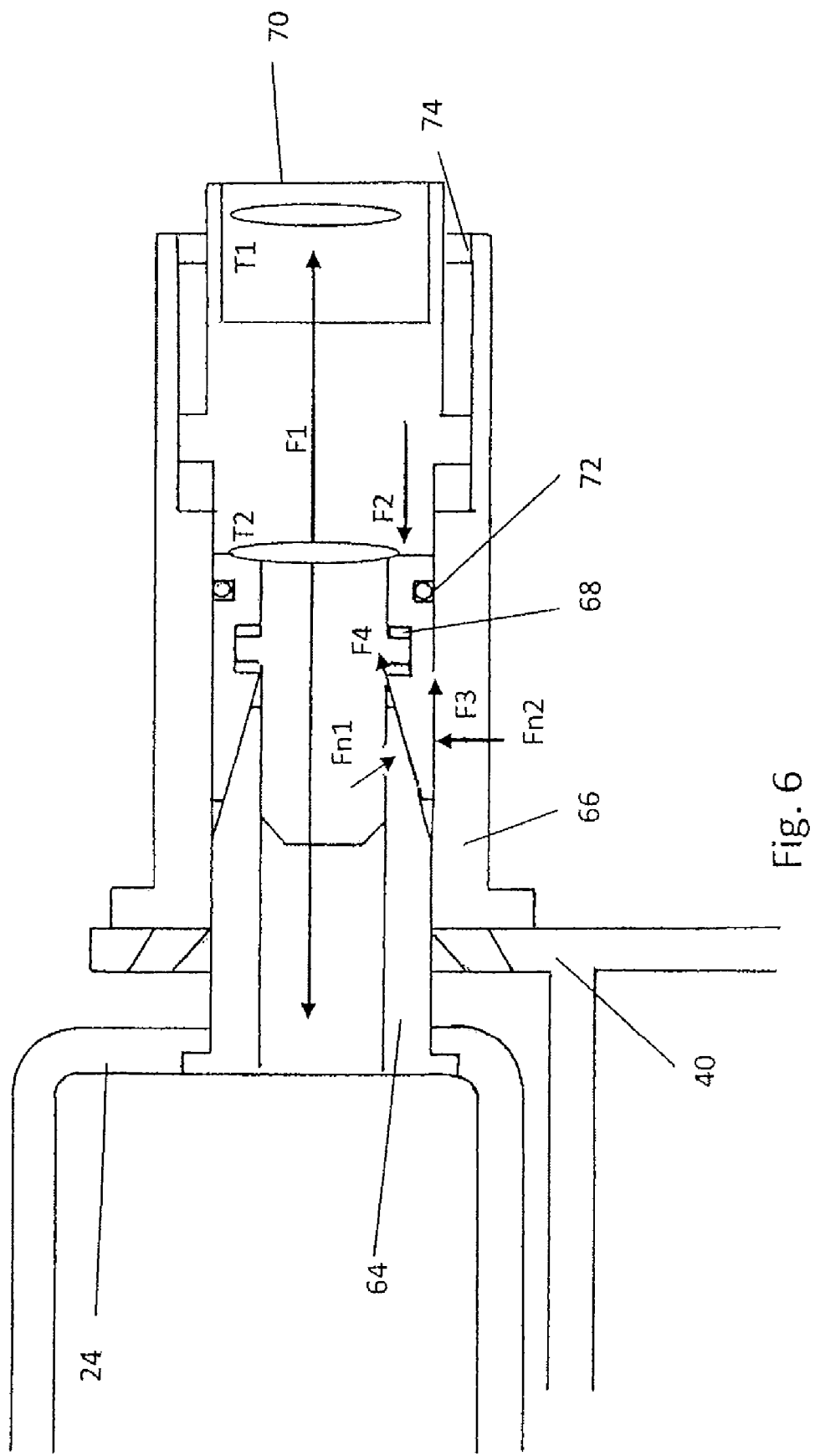
FIG. 6 illustrates a force analysis of the holding force of the holder of FIG. 4.

The screw 70 has an edge surface or shoulder, such as a raised ring or a change in diameter, for contacting the wedge 68 to provide inward driving force. As shown in FIG. 6, a change in diameter is used to apply force F2. The edge is positioned adjacent to the wedge 68 such that driving the screw 70 into the pin 64 presses the wedge 68 along a longitudinal axis of the pin 64 and retainer 66 within the retainer 66 against the chamfered surface.

A ring, shoulder, or other extensions are on the screw 70 for pulling the wedge 68 out to disengage the lock. In alternative embodiments, the ring extension is used to lock and unlock the wedge 68. The wedge 68 floats until engaged against the chamfered surface by the screw 70. By withdrawing the wedge 68, the wedge 68 again floats or is unengaged.

The screw 70 may include other extensions, such as an extension to keep the screw 70 within the retainer 66. The screw 70 is allowed to float or move within the retainer 66 such that the screw does not interfere with the pin 64 when inserting the linecard 14 into the chassis. The amount of movement is limited by the extent of the larger diameter within the retainer 66.

The c-ring 72 is a metal spring or wire. The c-ring fits around the wedge 68, such as in a groove on an outer circumference of the wedge 68. The c-ring keeps the separate wedge pieces from separating from the screw 70 when not in the retainer 66. The ring extension of the screw 70 limits the range of motion of the wedge 68 along the longitudinal axis of the screw 70. In other embodiments, the wedge 68 is a single piece and a press fit extension limits sliding of the wedge 68 relative to the screw. The c-ring 72 is optional, such as where the screw 70 cannot be removed from the retainer 66. In an alternative embodiment, the wedge 68 is formed as part of the screw 70 rather than a separate piece.

To secure the linecard 14 to the chassis 12, the screw 70 is rotated. The rotation causes the threads of the screw 70 to engage the threads of the pin 64. The rotation in the threading moves the screw 70 towards the pin 64 without also pressing the retainer 66 along the same axis. As the screw 70 moves along the longitudinal axis, the screw 70 moves the wedge 68. The wedge 68 moves along until contacting the chamfered surface of the pin 64. Continued rotation of the screw 70 causes greater pressure of the wedge 68 against the chamfered surface of the pin 64. The retainer 66 prevents the wedge 68 from expanding over the pin 64. Instead, friction is created between the pin 64 and the wedge 68. The wedge 60 also expands against the retainer 66, causing friction. The friction locks, holds, and/or fastens the retainer 66 relative to the pin 64, thus holding the linecard 14 relative to the chassis 12. The retainer 66 and pin 64 may maintain a relative position while the wedge 68 moves relative to both to lock the holder 16.

The holder 16 holds the linecard 14 relative to the chassis 12 without applying substantial pressure on the electrical connectors 26, 28. Since the screw 70 and wedge 68 may move relative to both the pin 64 and the retainer 66, operation of the screw 70 does not apply substantial pressure or create substantial movement of the linecard 14 relative to the chassis 12.

The holder 16 operates independent of any contact of the linecard 14 with the chassis 12. The holder 16 secures the linecard 14 relative to the chassis 12 at any one of a range of gaps between the face plate 40 of the linecard 14 and the chassis 12. FIG. 4 shows one example gap. In one embodiment, the range of available gaps is +/−0.05 inches. The wedge 68 contacts the chamfered surface of the pin 64 within the retainer 66. Any position along the longitudinal axis within the smaller diameter of the retainer 66 may be used as a lock point.

The electrical connectors 26, 28 and/or 58, 60 are seated as desired. The range of gaps corresponds to the desired mating of the electrical connectors 26, 28 and/or 58, 60. The electrical connector seating determines the amount of the pin 64 extending within the retainer 66. The holder 16 secures the face plate 40 without further driving the face plate 40 against the chassis 12 or card guide 24. The holder 16 secures with the electrical connectors 26, 28 and/or 58, 60 mated as desired (e.g., fully mated or bottomed out) without applying further substantial pressure to the electrical connectors 26, 28 and/or 58, 60, backplane or midplane 20, face plate 40, and/or card guide 24. The gap associated with mating of the connectors 26, 28 and/or 58, 60 is held in place.

The lock is removable. By reversing the screw 70, the ring extension or protrusion on the screw 70 contacts the wedge 68. The contact forces the wedge 68 to disengage from the chamfered surface and the retainer 66.

Figure 8:
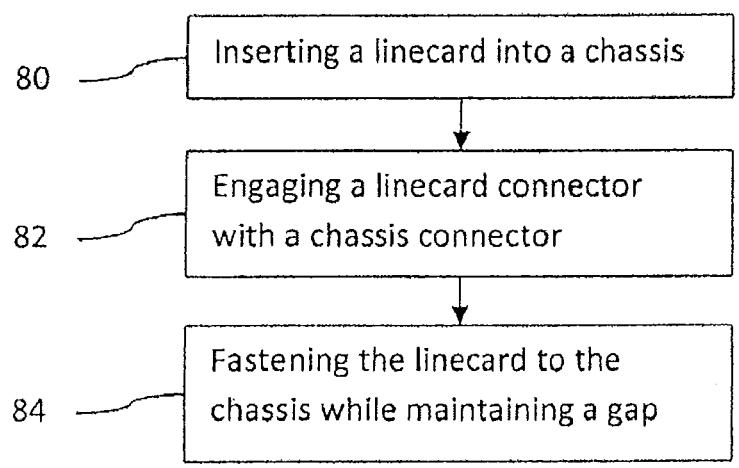
FIG. 8 is a flow chart diagram of one embodiment of a method for securing a linecard to a chassis.

FIG. 8 shows a method for securing a linecard to a chassis. The method uses the system of FIG. 1, the holder of FIGS. 4-7, or a different system or holder. The acts are performed in the order shown, but other orders may be provided. Additional, different, or fewer acts may be provided.

In act 80, a linecard is inserted within or against a chassis. The linecard is inserted by hand, but an automated or semi-automated insertion may be used. In one embodiment, the linecard is inserted, at least partially, with an ejector applying the insertion force. The linecard is placed in an opening of the chassis along a card guide. A linecard carrier may be aligned with the card guide. The linecard is slid along the card guide or positioned adjacent the card guide.

In act 82, a linecard electrical connector is engaged with a chassis electrical connector. One or more electrical connectors are mated. The mating occurs at the end of the insertion. The aligned linecard is pressed inward. The pressing causes mating of the connectors. The desired amount of connection engagement is provided. For example, an ejector is engaged to provide for full or complete electrical connector engagement. The ejector may provide sufficient engagement. Alternatively, the user may apply pressure for full engagement. Full engagement corresponds to the male connector bottoming out with the female connector or the electrical connectors otherwise preventing further insertion. In other embodiments, the electrical connectors are engaged sufficiently to provide operation but without bottoming out or are moved back after bottoming out.

During insertion, a pin and retainer also mate. The amount of insertion of the pin in, over, or along the retainer depends on the tolerances of parts given engagement of the electrical connectors.

Once inserted a desired amount, the ejector may be loosened and/or other forces for causing insertion may be removed. Where the pin and retainer are located on a top of the linecard given an upright position of the chassis, the linecard hangs in place by the electrical connectors, ejector, and/or the pin. Friction keeps the linecard in place. The locking screw or other clamping device is not engaged yet. For example, the screw 70 of the holder 16 of FIG. 4 is floating in the captive retainer 66. The linecard is positioned as desired, such as with sufficient pin contact, within the chassis. Alternatively, the forces remain in place, but preferably without causing bending of the linecard, face plate, chassis, or midplane/backplane.

In act 84, the linecard is fastened relative to the chassis after the electrical connectors are engaged. The linecard is within or on the chassis. The fastening occurs within or outside of the chassis.

Once the linecard is fully inserted or inserted as far as desired, one or more gaps may exist between the linecard and the chassis. For example, a gap exists between the card guide of the chassis and the face plate of the linecard. The size and tolerances of the chassis and linecard parts are set to allow for a gap. If the chassis parts stack on the short side of the tolerance and the linecard parts stack on the long side of tolerance, a larger gap may result. If the chassis parts stack on the long side of the tolerance and the linecard parts stack on the short side of tolerance, a smaller or no gap may result.

The fastening leaves at least some of any gap rather than creating pressure to fully close the gap. In one embodiment, the fastening substantially maintains any gap. Any gap is left so that less strict tolerances may be used while allowing complete electrical connection and securing of the linecard to the chassis. The fastening clamps or otherwise fixes the linecard relative to the chassis without applying further substantial insertion or removal force. For example, a pin is inserted in one of several holes. As another example, a wedge, cam, screw, or clamp causes friction or other force generally in a direction within a plane of a face plate rather than towards or away from the electrical connectors. The fastening fails to substantially close the first gap. Substantially is used to account for movement caused by or pressure applied to turn a screw or otherwise handle the fastening. The fastening device applies pressure predominantly in a direction perpendicular to the axis of insertion.

In one embodiment, the fastening is performed with a screw oriented along an insertion axis. For example, the holder of FIGS. 4-7 is used. This provides a user with a same experience as the standard captive screw but without the screw forcing the face plate against the card guide. The user rotates the screw into the pin to fasten. The screw causes a piece of the linecard to wedge with a piece of the chassis. As the screw installs into the pin, the wedges move into place against the pin and the captive retainer. Once the screw is torqued down, the axial force of the screw creates normal forces between the pin, wedges and retainer, holding the card in X, Y and Z axes.

The linecard is held within the chassis without resulting in substantial movement or increase in pressure of the linecard pin connector relative to or against the pin connector held by the chassis. For example, an extension from the linecard is held relative to the chassis. The locking or connection occurs at any of a plurality of positions along the extension.

Figure 7:
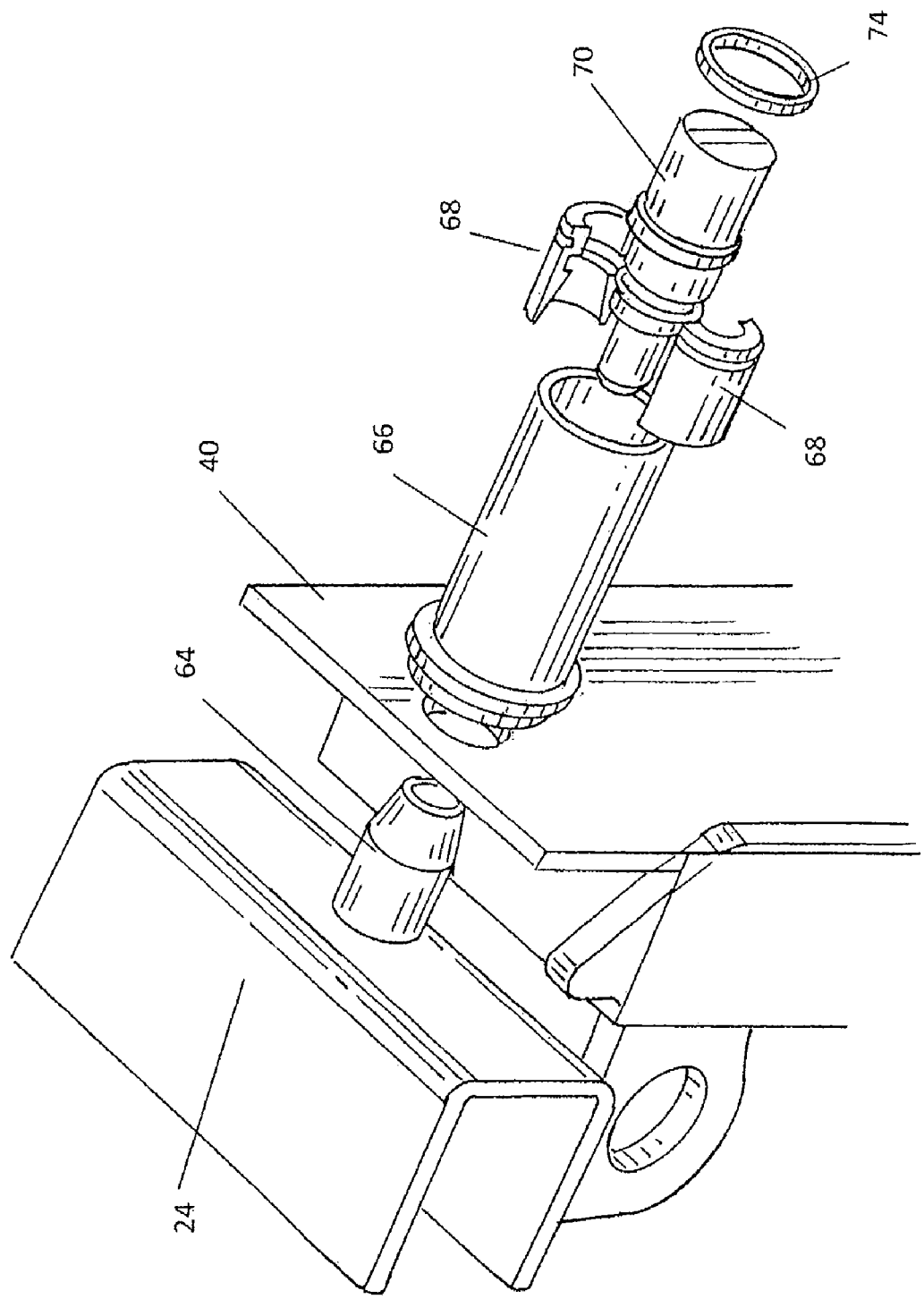
FIG. 7 is a perspective, exploded view of the holder of FIG. 4.

FIG. 6 shows an example determination of an amount of hold power provided by the holder 16 shown in FIGS. 5 and 7. The longitudinal or insertion axis is defined as the axis Y. The pin 64 within the retainer 66 and the wedge 68 holds the linecard in the X and Z directions. The holding force (i.e., frictional holding force F3) in the Y direction is determined in this example.

Various assumptions are made in this example calculation. The static coefficient of friction ($\mu$) is assumed to be 0.3 for the wedge angle interface, and the static coefficient of friction ($Я$) is assumed to be 0.6 for the wedge retainer interface. Measurements or data may indicate other values, such as due to different surface finishes. The static coefficient of friction ($ă$) between the wedge and the screw by way of a Teflon washer is 0.04, and T-user (tightening torque applied by the user) is assumed to be 10 in-lbs minimum. In this example, the wedge angle ($\theta$)=15 degrees, Ds=diameter of 3.5 mm screw, and Dw=diameter to the center of the wedge shoulder. With the initial tightening torque of 10 in-lbs minimum, the axial force F1 is approximated by T1=0.2*Ds*(F1)+(F1*ă)*Dw/2. Solving this equation, F1~321 lbf. With the friction coefficient ă being small, the resistive torque from the wedge shoulder is small. F4=$\mu$*Fn1, F3=$Я$*Fn2, and F2=(F1)/2 since there are two wedges. Assuming negligible Z axis forces between the wedge and screw, $\Sigma$Fz on the wedge=0. Fn1*cos $\theta$−F4*sin $\theta$−Fn2=0, $\Sigma$Fy on the wedge=0, and F2−F3−F4*cos $\theta$−Fn1*sin $\theta$=0. Substituting and solving for F3:

$$F3=0.5*F1/[1+\mu*\cos\theta/(Я*\cos\theta-Я*\mu*\sin\theta)+\sin\theta/\{Я*(\cos\theta-\mu*\sin\theta)\}]$$

F3 in this case ~79 lbf. Since there are two wedges, a total of 158 lbs of retention force is provided per "FI" holding mechanism. Where there are two holders per linecard, a total of about 316 lbs retention force for the linecard plus any friction from the card guides and connectors is provided. As the coefficient of friction $\mu$ of the angle surface is reduced, and the coefficient of friction $Я$ to the retainer is increased, the holding power of the system in Y is increased. The actual coefficients of friction may be designed to provide a desired holding force. Different surface finishes on various surfaces or another local Teflon or low friction coating on the chassis pin may be used.

Assuming a 15 lb linecard in the system, the paired retaining mechanism (two holders) alone may resist a 20 G acceleration of the linecard in the Y direction before the frictional force is overcome, given the assumptions for friction coefficients and installation torque. The screw and pin design may handle over 20 in-lbs torque, increasing the holding power by two times. The screw is large and the drive mechanism can be made very robust, such as a recessed slot drive. In X and Z directions, the holder may resist as much force as required to break the pin out of the sheet metal of the chassis.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A system comprising:
   a chassis having a second electrical connector arranged to mate with a first electrical connector of a linecard when the linecard is removeably positioned within the chassis; and
   a holding connector arranged to connect the linecard to the chassis, the holding connector comprising a pin with a chamfered surface, a wedge arranged to contact the chamfered surface, a retainer, and a drive arranged to drive the wedge against the chamfered surface such that friction between the wedge and the chamfered surface removably holds the linecard relative to the chassis.

2. The system of claim 1 wherein the drive is arranged to drive the wedge against the chamfered surface such that the friction holds the pin relative to the retainer, the pin extending from the chassis and the retainer extending from the linecard.

3. The system of claim 1 wherein the pin has a longitudinal axis and the chamfered surface is at an angle of about 10-25 degrees from the longitudinal axis, and wherein the wedge comprises a similar angle as the angle of the chamfered surface.

4. The system of claim 1 wherein the pin or retainer connects with the chassis or linecard in a groove such that the pin or retainer slides relative to the chassis or linecard.

5. The system of claim 1 wherein the pin connects with a card guide of the chassis, the pin including an inner threading, wherein the retainer connects with a face plate of the linecard, the retainer having an inner diameter to accept the pin within the retainer, wherein the wedge comprises a cylinder insertable within the retainer, and wherein the drive comprises a screw with outer threading matable with the inner threading of the pin, the screw having an edge positioned adjacent to the wedge such that driving the screw into the pin presses the wedge, along a longitudinal axis of the pin and retainer, against the chamfered surface within the retainer.

6. The system of claim 5 wherein the holding connector further comprises a c-ring around the wedge and the screw, the c-ring holding the wedge adjacent the screw when not in the retainer.

7. The system of claim 1 wherein the holding connector holds the linecard relative to the chassis without applying substantial pressure on the first and second electrical connectors.

8. The system of claim 1 wherein the holding connector holds the linecard relative to the chassis independent of any contact of the linecard with the chassis.

9. The system of claim 1 wherein the holding connector holds the linecard relative to the chassis without driving a card guide of the chassis against a face plate of the linecard.

10. The system of claim 1 wherein the holding connector is configured to hold the linecard relative to the chassis at any one of a range of gaps between a face plate of the linecard and the chassis, the retainer and the pin are adjacent each other over the range of gaps, and the holding connector is configured to hold the retainer relative to the pin over the range of gaps.

11. The system of claim 10 wherein the range of gaps corresponds to the first electrical connector operably mated with the second electrical connector, the holding connector configured to hold without driving the face plate of the linecard against the chassis.

12. The system of claim 10 wherein a first gap of the range of gaps corresponds to the first electrical connector fully mated with the second electrical connector, and the holding connector is configured to hold without driving the face plate of the linecard against the chassis and without substantially increasing a pressure of the first electrical connector against the second electrical connector.

13. A system comprising:
    a linecard having a first electrical connector arranged to mate with a second electrical connector of a chassis when the linecard is removeably positioned within the chassis; and
    a holding connector configured to hold the linecard relative to the chassis at any one of a range of gaps between a face plate of the linecard and the chassis, the holding connector comprising a wedge, a pin, and a retainer, a longitudinal segment of the in received within the retainer, the wedge sized and shaped to contact the pin within the retainer, the contact forming a frictional holding force;
    wherein the range of gaps between the face plate of the linecard and the chassis comprises a first gap and a second gap that is smaller than the first gap, and the longitudinal segment of the pin received within the retainer at the first gap is shorter than the longitudinal segment of the pin received within the retainer at the second gap.

14. The system of claim 13 wherein the range of gaps corresponds to the first electrical connector operably mated with the second electrical connector, the holding connector configured to hold without driving the face plate against the chassis.

15. The system of claim 13 wherein the pin has a beveled surface, and the wedge is sized and shaped to contact the beveled surface within the retainer.

16. The system of claim 13 wherein the second gap of the range of gaps corresponds to the first electrical connector fully mated with the second electrical connector, the holding connector configured to hold without driving the face plate against the chassis and without substantially increasing a pressure of the first electrical connector against the second electrical connector.

17. The system of claim 13 wherein the holding connector further comprises a drive arranged to drive the wedge against the pin such that the frictional holding force holds the pin relative to the retainer, the pin extending from the chassis and the retainer extending from the linecard.

18. The system of claim 15 wherein the pin connects with a card guide of the chassis, the pin including an inner threading, wherein the retainer connects with the face plate of the linecard, the retainer having an inner diameter to accept the pin within the retainer, wherein the wedge comprises a cylinder insertable within the retainer, and wherein the holding connector further comprises a drive comprising a screw with outer threading matable with the inner threading of the pin, the screw having an edge positioned adjacent to the wedge such that driving the screw into the pin presses the wedge, along a longitudinal axis of the pin and the retainer, against the beveled surface of the pin within the retainer.

19. The system of claim 18 wherein the holding connector further comprises a c-ring around the wedge and the screw, the c-ring holding the wedge adjacent the screw when not in the retainer.

* * * * *

UNITED STATES PATENT AND TRADEMARK OFFICE
CERTIFICATE OF CORRECTION

| | |
|---|---|
| PATENT NO. | : 8,233,285 B2 |
| APPLICATION NO. | : 12/581629 |
| DATED | : July 31, 2012 |
| INVENTOR(S) | : Christopher Zieman |

It is certified that error appears in the above-identified patent and that said Letters Patent is hereby corrected as shown below:

Column 12, Line 17, please delete "in" and insert --pin--.

Signed and Sealed this
Second Day of October, 2012

David J. Kappos
*Director of the United States Patent and Trademark Office*